United States Patent
Kim et al.

(10) Patent No.: US 7,573,289 B2
(45) Date of Patent: Aug. 11, 2009

(54) IMPEDANCE MATCHING CIRCUIT AND SEMICONDUCTOR MEMORY DEVICE WITH THE SAME

(75) Inventors: Ki-Ho Kim, Kyoungki-do (KR); Chun-Seok Jeong, Kyoungki-do (KR)

(73) Assignee: Hynix Semiconductor, Inc., Gyeonggi-do (KR)

( * ) Notice: Subject to any disclaimer, the term of this patent is extended or adjusted under 35 U.S.C. 154(b) by 37 days.

(21) Appl. No.: 11/967,576

(22) Filed: Dec. 31, 2007

(65) Prior Publication Data
US 2008/0211533 A1 Sep. 4, 2008

(30) Foreign Application Priority Data
Mar. 2, 2007 (KR) .................... 10-2007-0020728

(51) Int. Cl.
*H03K 19/0175* (2006.01)
(52) U.S. Cl. .......................................... 326/30; 326/86
(58) Field of Classification Search .................. 326/30, 326/86, 87; 327/108
See application file for complete search history.

(56) References Cited

U.S. PATENT DOCUMENTS

| | | | |
|---|---|---|---|
| 6,762,620 B2 * | 7/2004 | Jang et al. ..................... | 326/30 |
| 6,828,820 B2 * | 12/2004 | Ohno ........................... | 326/30 |
| 6,836,144 B1 | 12/2004 | Bui et al. | |
| 7,071,728 B2 | 7/2006 | Chandler et al. | |
| 7,408,379 B2 * | 8/2008 | Cho et al. ..................... | 326/30 |
| 2008/0048714 A1* | 2/2008 | Lee et al. ...................... | 326/30 |
| 2008/0100333 A1* | 5/2008 | Kim et al. ..................... | 326/30 |
| 2008/0100334 A1* | 5/2008 | Kim et al. ..................... | 326/30 |
| 2008/0284467 A1* | 11/2008 | Koo ............................. | 326/30 |

FOREIGN PATENT DOCUMENTS

KR      1020040043995      5/2004

* cited by examiner

*Primary Examiner*—Vibol Tan
(74) *Attorney, Agent, or Firm*—Mannava & Kang, P.C.

(57) ABSTRACT

An impedance matching circuit includes a code generating unit for generating a calibration code in response to a reference voltage and a voltage on a node, a calibration resistance unit for supplying a power supply voltage to the node, being calibrated to an external resistor, wherein the calibration resistance unit includes a switching unit for turning on/off a plurality of resistors connected in parallel in response to the calibration code, a termination pull-up resistance unit provided at an output node for receiving the calibration code, wherein the termination pull-up resistance unit has a switching unit which is identical to that of the calibration resistance unit, and a termination pull-down resistance unit at the output node, for receiving the calibration code, wherein the termination pull-down resistance unit has a switching unit which is identical to that of the calibration resistance unit.

16 Claims, 4 Drawing Sheets

IMPEDANCE MATCHING CIRCUIT AND SEMICONDUCTOR MEMORY DEVICE WITH THE SAME

CROSS-REFERENCE TO RELATED APPLICATIONS

The present invention claims priority to Korean patent application number. 10-2007-0020728, filed on Mar. 2, 2007, which is incorporated by reference in its entirety.

BACKGROUND OF THE INVENTION

The present invention relates to an impedance matching circuit used in semiconductor ICs, such as memory devices, and more particularly to an impedance matching circuit with a ZQ calibration.

Generally, various semiconductor devices implemented by integrated circuits such as CPU's, memories and gate arrays are used for various digital products such as personal computers, servers and work stations. For the most part, semiconductor devices have an input circuit for receiving different signals from an external circuit through input pads and an output circuit for providing internal signals to the external circuit.

As the operation speed of digital products becomes higher, the swing width of the signals which are interfaced between semiconductor devices is decreased. The reason why the swing width is getting narrower is that it is necessary to minimize the transmission time of the signals. However, the narrower the swing width is, the more the semiconductor devices are influenced by the external noise and the more serious the echo-back signal caused by impedance mismatching at the interface. Impedance mismatching is generated by external noise, a change of power supply voltage or temperature or a change in the manufacturing process. If impedance mismatching is created, it is difficult to transmit the data at a high speed and the output data from an output terminal of the semiconductor device can be distorted. Therefore, in the case where the semiconductor device at the receiving side receives the distorted output signal through its input terminal, problems such as setup/hold failure or misjudgment can be caused frequently. Semiconductor devices, in which high speed operation is required employ an impedance matching circuit in the vicinity of a pad within the integrated circuit chip to attempt to solve these problems.

A ZQ calibration refers to a process of producing pull-up and pull-down codes based on the fluctuations of the PVT (process, voltage, and temperature) conditions. The resistances (termination resistance of a DQ pad in case of a memory device) of input and output circuits are controlled by using the codes which are caused by the result of the ZQ calibration.

Hereinafter, a ZQ calibration circuit performing the ZQ calibration will be described FIG. 1 is a block diagram of a conventional ZQ calibration circuit. The conventional ZQ calibration circuit includes a first pull-up resistance unit 110, a second pull-up resistance unit 120, a pull-down resistance unit 130, a reference voltage generator 102, comparators 103 and 104, and pull-up and pull-down counters 105 and 106.

A supply voltage VDDQ is divided by the first pull-up resistance unit 110 and a reference resistor 101, thereby providing a ZQ voltage to a node ZQ. The reference resistor 101 connected to a pad ZQ coupled to the node ZQ typically has resistance of 240Ω. The comparator 103 compares the ZQ voltage to a reference voltage VREF (typically, set to VDDQ/2), which is produced by the reference voltage generator 102, and then produces up/down signals using the comparison result.

The pull-up counter 105 receives the up/down signals and then produces a binary code PCODE<0:N>. The resistance value of the first pull-up resistance unit 110 is controlled by a switching operation of resistors through the binary code PCODE<0:N>. The controlled resistance value of the pull-up resistance unit 110 influences the node ZQ and this operation is repeated. In other words, the first pull-up resistance unit 110 undergoes calibration so that the total resistance value of the first pull-up resistance unit 110 is the same as the resistance value of the reference resistance 101 (typically 240Ω), which is called a pull-up calibration.

A pull-up calibration code PCODE<0:N> generated by the pull-up calibration process is inputted to the second pull-up resistance unit 120, thereby determining the total resistance of the second pull-up resistance unit 120. Because the second pull-up resistance unit 120 has the same configuration as the first pull-up resistance unit 110, it has the same resistance value as the first pull-up resistance unit 110 in response to the same code. Similar to pull-up calibration, pull-down calibration starts in such a manner that a voltage on a node A becomes the same as the reference voltage VREF by using the comparator 104 and the pull-down counter 106. In other words, the total resistance value of the pull-down resistance unit 130 becomes the same as that of the second pull-up resistance unit 120, thereby generating a pull down code NCODE<0:N>, which is called a pull-down calibration.

The pull-up calibration code PCODE<0:N> and the pull-down calibration code NCODE<0:N>, which are generated as the result of the ZQ calibration, are inputted into pull-up and pull-down termination resistance units (which are identical to the pull-up and pull-down resistance unit of the ZQ calibration unit) of the input/output terminal (the DQ pad in case of the memory device) of the semiconductor device and it then decides the termination resistance value (not shown).

Since the ZQ calibration is performed based on the codes of N+1, it has problems in that a mismatch exists between the external resistor 101 and the first pull-up resistance unit 110 according to the value of N and another mismatch also exists between the second pull-up resistance unit 120 and the pull-down resistance unit 130.

Moreover, in case of the pull-down calibration, there is a problem in that a mismatch between the external resistor 101 and the pull-down resistance unit 130 is enlarged as a total of the mismatch between the external resistor 101 and the first pull-up resistance unit 110 and the mismatch between the second pull-up resistance unit 120 and the pull-down resistance unit 130.

FIG. 2 is a timing chart of an operation in which voltages on nodes ZQ and A follow a voltage waveform of a reference voltage (1/2VDDQ) based on a ZQ calibration. Because the reference voltage (1/2VSSQ) is different from the ZQ voltage on the node ZQ, the resistance value of the first pull-up resistance unit 110 is different from that of the external resistor 101. Because the reference voltage (1/2VDDQ) is different from the voltage on the node A, the resistance value of the second pull-up resistance unit 120 is different from that of the pull-down resistance unit 130. Accordingly, such the mismatch can be shown in FIG. 2.

SUMMARY OF THE INVENTION

The present invention is directed to providing an impedance matching circuit capable of reducing a mismatch in a ZQ calibration.

In one embodiment, an impedance matching circuit of a semiconductor memory device includes a code generating unit configured to generate a calibration code in response to a reference voltage and a voltage on a node, a calibration resistance unit configured to supply a power supply voltage to the node and calibrated to an external resistor, wherein the calibration resistance unit includes a switching unit configured to turn on/off a plurality of resistors connected in parallel in response to the calibration code, a termination pull-up resistance unit provided at an output node configured to receive the calibration code, wherein the termination pull-up resistance unit has a switching unit identical to that of the calibration resistance unit, and a termination pull-down resistance unit at the output node, configured to receive the calibration code wherein the termination pull-down resistance unit has a switching unit which is identical to that of the calibration resistance unit.

In another embodiment, an impedance matching circuit of a semiconductor memory device includes a code generating unit configured to generate a calibration code in response to a reference voltage and a voltage on a node, a calibration resistance unit configured to supply a ground voltage to the node and calibrated to an external resistor, wherein the calibration resistance unit includes a switching unit configured to turn on/off a plurality of resistors connected in parallel in response to the calibration code, a termination pull-up resistance unit provided at an output node configured to receive the calibration code, wherein the termination pull-up resistance unit has a switching unit identical to that of the calibration resistance unit, and a termination pull-down resistance unit at the output node configured to receive the calibration code, wherein the termination pull-down resistance unit has a switching unit which is identical to that of the calibration resistance unit.

DESCRIPTION OF SPECIFIC EMBODIMENTS

Hereinafter, a semiconductor memory device in accordance with the present invention will be described in detail referring to the accompanying drawings.

Figure 1:
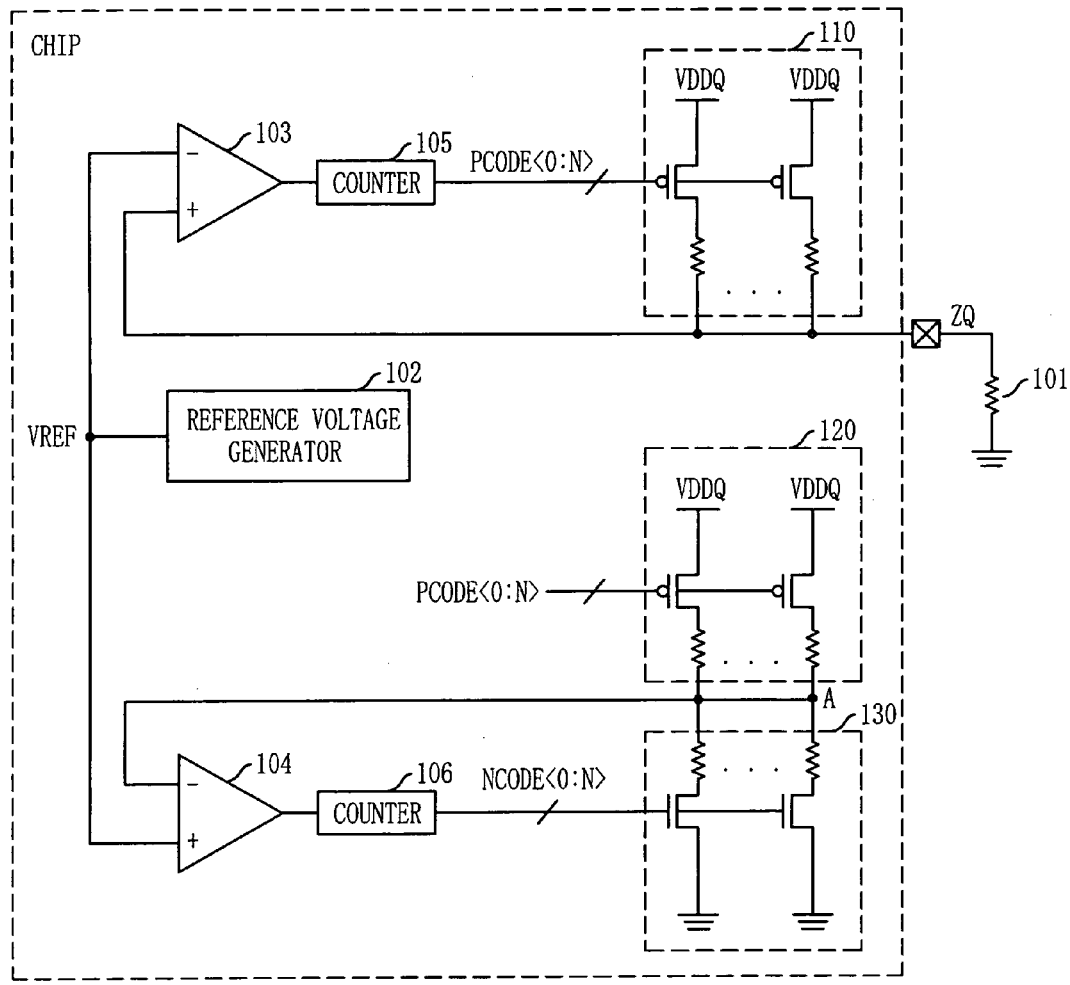
FIG. 1 is a block diagram of a conventional ZQ calibration circuit.
Figure 3:
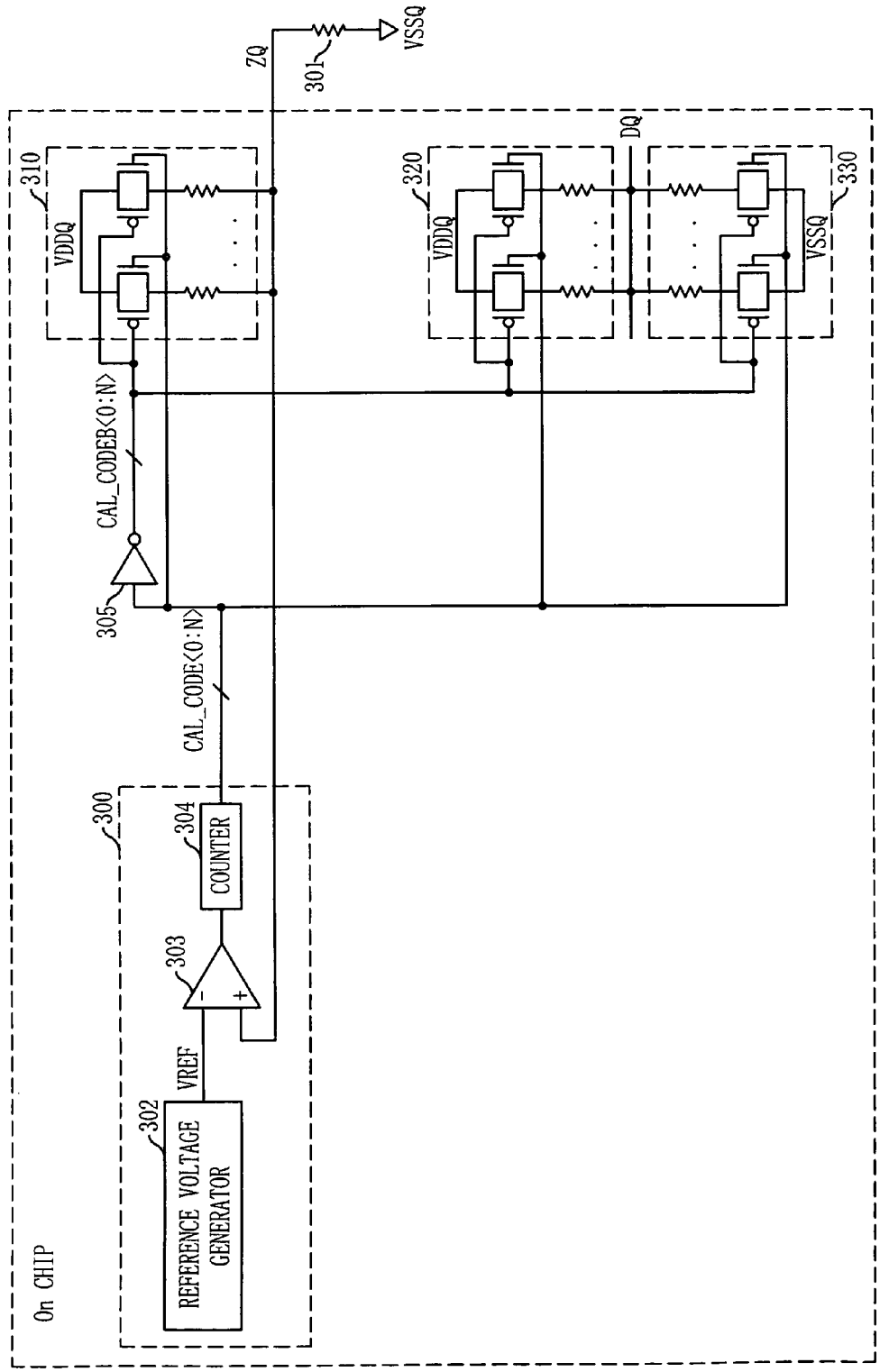
FIG. 3 is a block diagram of an impedance matching circuit according to one embodiment of the present invention.

FIG. 3 is a block diagram of an impedance matching circuit according to one embodiment of the present invention. The impedance matching circuit according to one embodiment of the present invention includes a code generating unit 300 (302, 303 and 304), a calibration resistance unit 310, a termination pull-up resistance unit 320 and a termination pull-down resistance unit 330. The code generating unit 300 generates a calibration code CAL_CODE<0:N> in response to both a reference voltage (typically 1/2VDDQ) VREF and a voltage on a node ZQ. The calibration resistance unit 310 supplies a supply voltage VDDQ to the node ZQ in response to the calibration code CAL_CODE<0:N>, thereby being calibrated to an external resistor 301. The termination pull-up and pull-down resistance units 320 and 330 have the same configuration as the calibration resistance unit 310 and receive the calibration code CAL_CODE<0:N> for an operation. In other words, in the present invention, all the switching elements to control the resistance value by performing ON/OFF control of the parallel coupled resistors has the same configuration in the calibration resistance unit 310, the termination pull-up resistance unit 320 and the termination pull-down resistance unit 330. Referring again to FIG. 1, in the conventional impedance matching circuit, the switching elements are different from each other in the pull-up or pull-down operation.

The code generating unit 300 and the calibration resistance unit 310 are made up of a ZQ calibration circuit and the termination pull-up resistance unit 320 and termination pull-down resistor unit 330 correspond to a termination circuit of an input or an output terminal.

The code generating unit 300 includes a reference voltage generating unit 302 to generate a reference voltage VREF, a comparator 303 to compare the reference voltage VREF to a voltage on the node ZQ, and a counter 304 to count the calibration code CAL_CODE<0:N> based on the comparison result of the comparator 303. When the voltage on the node ZQ is higher than the reference voltage VREF, the code generating unit 300 counts the code in a direction in which the resistance value of the calibration resistance unit 310 is higher. On the other hand, when the voltage on the node ZQ is less than the reference voltage VREF, the code generating unit 300 counts the code in a direction in which the resistance value of the calibration resistance unit 310 is lower.

The calibration resistance unit 310 includes a plurality of resistors and switching elements which perform the switching operation to turn on/off the plurality of resistors in response to the calibration code CAL_CODE<0:N> in order to control the resistance value. More specifically, the switching elements include a plurality of pairs of an NMOS transistor and a PMOS transistor which are connected to each other in parallel. Gates of the NMOS transistors receive corresponding codes of the calibration code CAL_CODE<0:N> and gates of the PMOS transistors also receive corresponding codes of the calibration code CAL_CODE<0:N> via an invert 305. The pair of the NMOS transistor and the PMOS transistor is turned on/off simultaneously as a switch because the PMOS transistor receives the code via the invert 305.

The termination pull-up resistance unit 320 and the termination pull-down resistor unit 330 are provided in the output node. In other words, they are disposed at a place where the impedance matching is required. In FIG. 3, the termination pull-up resistance unit 320 and the termination pull-down resistor unit 330 are shown at the node to which a data pad (DQ pad) is connected. This configuration is provided for those semiconductor devices where impedance matching is required at the DQ pad side. For other semiconductor devices, the termination pull-up resistance unit 320 and the termination pull-down resistor unit 330 can be disposed at a different place.

Each of the termination pull-up resistance unit 320 and the termination pull-down resistor unit 330 is made identically with the calibration resistance unit 310 and operates with the calibration code CAL_CODE<0:N>. The conventional termination pull-up and pull-down resistance units are different from each other in their configurations and the input codes applied to them are different from each other. However, the configurations of the termination pull-up resistance unit 320 and the termination pull-down resistor unit 330 are identical and they receive the same calibration code CAL_CODE<0:N> in the present invention.

In operation, the comparator 303 compares the voltage on the node ZQ to the reference voltage VREF and outputs an up/down signal. The counter 304 produces the calibration code CAL_CODE<0:N> by counting the up/down signals. The resistance value of the calibration resistance unit 310 is controlled according to the calibration code CAL_CODE<0:N>. The result is again reflected on the comparator 303 and the calibration resistance unit 310 has the same resistance value as the external resistor 301 with the repeated same processes. The code generated from this process is the calibration code CAL_CODE<0:N>.

The generated calibration code CAL_CODE<0:N> is inputted to the termination pull-up resistance unit 320 and the termination pull-down resistor unit 330 and it makes the impedance matching. The termination pull-up and the pull-down resistance unit 320 and 330 of the present invention have the same configuration. It means that they include the same element; however, the location of the resistors and the switching elements may be changed as shown in FIG. 3. Accordingly, the termination pull-up resistance unit 320 and the termination pull-down resistor 330 unit need the same code. Therefore, one calibration code CAL_CODE<0:N> is produced by one calibration and this is used for the impedance matching.

The conventional ZQ calibration carries out the processes of both the pull-down calibration and the pull-up calibration twice. Therefore, two mismatches, one mismatch between the first pull-up resistance unit and the external resistor and the other mismatch between the second pull-up resistance unit and the pull-down resistance unit, are generated. However, the present invention provides the advantage that only one mismatch between the calibration resistance unit 310 and the external resistor 301 exists because one calibration is carried out. The total mismatch is therefore decreased by half in comparison to the convention calibration. Moreover, an additional advantage is that the ZQ calibration as herein described can increase speed because only one calibration is carried out.

Figure 4:
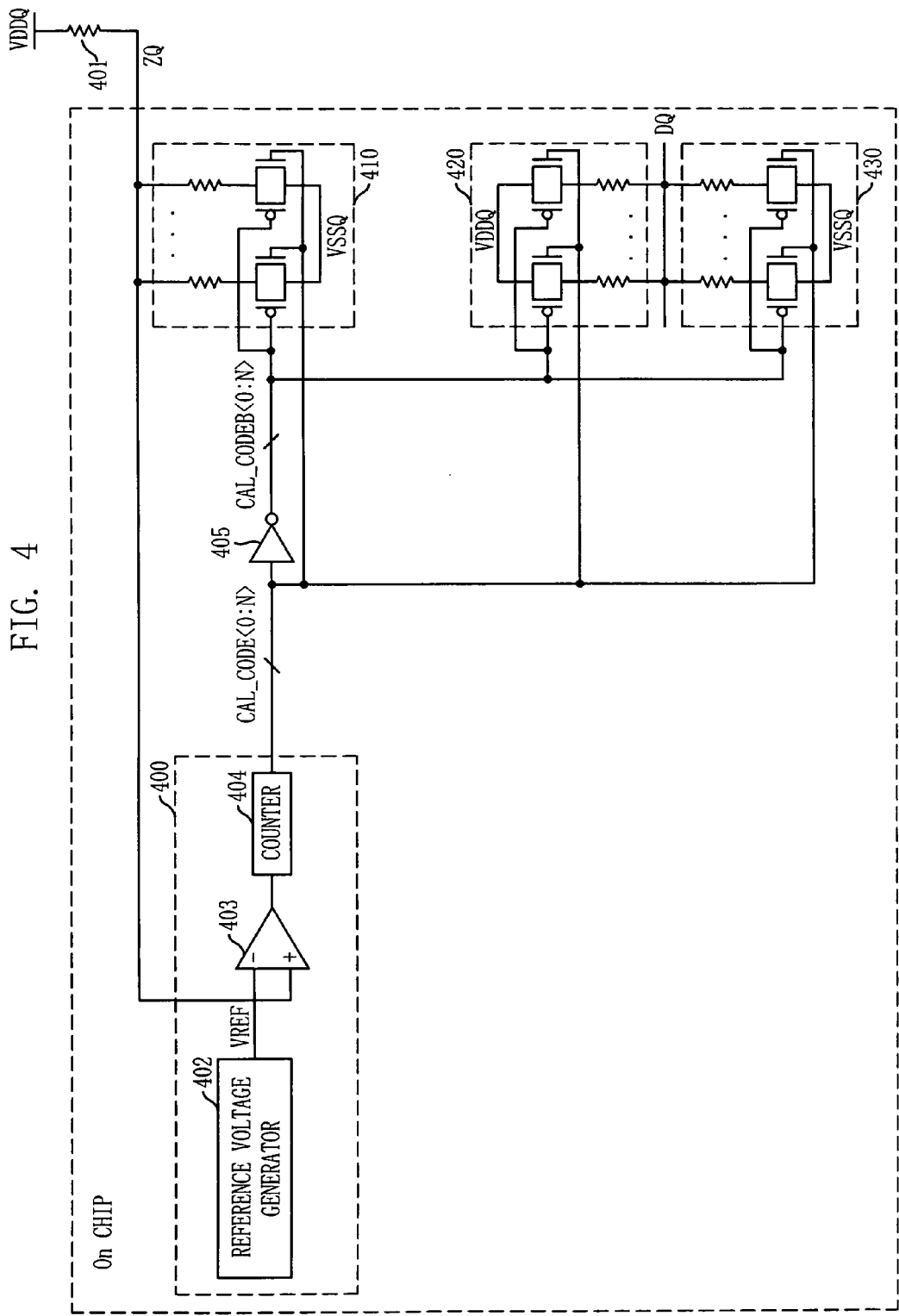
FIG. 4 is a block diagram of an impedance matching circuit according to another embodiment of the present invention.

FIG. 4 is a block diagram of an impedance matching circuit according to another embodiment of the present invention. The impedance matching circuit in this embodiment includes a code generating unit 400 (402, 403 and 404), a calibration resistance unit 410, a termination pull-up resistance unit 420 and a termination pull-down resistance unit 430.

The code generating unit 400 generates a calibration code CAL_CODE<0:N> in response to a voltage on a node ZQ and a reference voltage VREF. The calibration resistance unit 410 supplies a ground voltage VSSQ to the node ZQ in response to the calibration code CAL_CODE<0:N>, thereby being calibrated to an external resistor 401. The termination pull-up and pull-down resistance units 420 and 430 have the same configuration as the calibration resistance unit 410 and receive the calibration code CAL_CODE<0:N> for an operation.

In the embodiment of FIG. 3, the external resistor 301 is connected between the external pad (ZQ pad) and a ground voltage VSSQ (the external resistor operates as a pull-down element). Therefore, the calibration resistance unit 310 produces the calibration code by performing the calibration operation in similar to the conventional pull-up calibration. However, in the embodiment of FIG. 4, the external resistor 401 is connected between the external pad (ZQ pad) and the power supply voltage VDDQ (the external resistor operates as a pull-up element). Accordingly, the calibration resistance unit 410 produces the calibration code by performing the calibration operation in a manner similar to conventional pull-down calibration, with the difference being whether the calibration resistance unit operates as the pull-up or pull-down calibration.

The difference between the code generating unit 300 of one embodiment and the code generating unit 400 of another embodiment can be determined by the direction of count. In other words, in the embodiment of FIG. 3, the code is counted to a direction in which the resistance value of the calibration resistance unit 310 increases when the voltage on the node ZQ is higher than the reference voltage VREF. On the other hand, in the embodiment of FIG. 4, the code is counted to a direction in which the resistance value of the calibration resistance unit 410 decreases when the voltage on the node ZQ is higher than the reference voltage VREF. This difference can be implemented by changing input terminals (positive (+) and negative (−) terminals) or modifying the scheme of the counters 304 and 404.

Similarly, in the embodiment of FIG. 4, the termination pull-up resistance unit 420 has the same configuration as the termination pull-down resistance unit 430 and they need the same code. Therefore, one calibration code CAL_CODE<0:N> is produced by one ZQ calibration.

In FIG. 4, the calibration code CAL_CODE<0:N> is also produced through the comparison of the voltage on the node ZQ and the reference voltage VREF and the impedance matching is achieved by using the generated calibration code CAL_CODE<0:N>. Since the basic operation and configuration of those of FIGS. 3 and 4 are the same, the detailed description will be omitted from FIG. 4.

Figure 2:
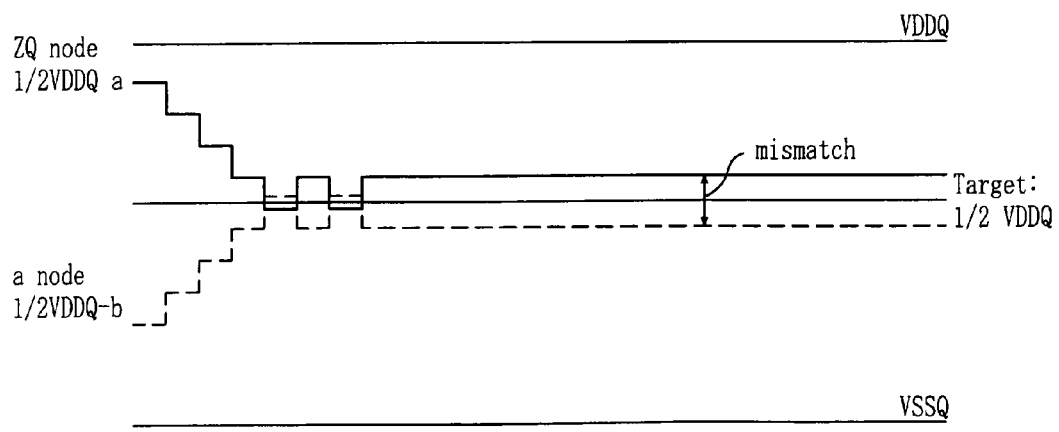
FIG. 2 is a timing chart of an operation in which voltages on nodes ZQ and A follow a voltage waveform of a reference voltage (1/2VDDQ) based on a ZQ calibration.
Figure 5:
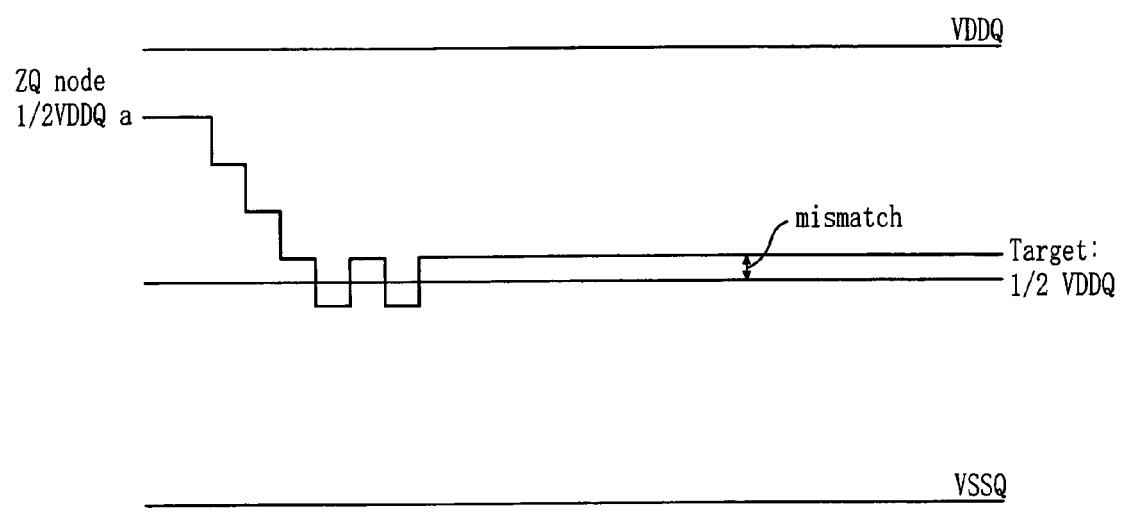
FIG. 5 is a timing chart of an operation in which voltages on a node ZQ follow a voltage waveform of a reference voltage (1/2VDDQ) based on a ZQ calibration according to the present invention.

FIG. 5 is a timing chart of an operation in which the voltage on the node ZQ follows a voltage waveform of the reference voltage (1/2VDDQ) based on the ZQ calibration according to the present invention. As shown in FIG. 5, as time passes, the voltage on the node ZQ is calibrated to the reference voltage (1/2VDDQ). When compared to the range of the mismatch of FIG. 2, the range of the mismatch of FIGS. 3 and 4 in the calibration operation is half.

Since the impedance matching circuit according to the present invention has the termination pull-up resistance unit which has the same the configuration as the termination pull-down resistance unit, one ZQ calibration code is provided through only one calibration operation. Therefore, a mismatch which is generated in the ZQ calibration can be reduced by half and the ZQ calibration can proceed at increased speed. Moreover, since it is necessary to conduct the generation of one ZQ calibration code through only one calibration operation, circuit configuration can be simplified and chip size can be reduced.

While the present invention has been described with respect to the particular embodiments, it will be apparent to those skilled in the art that various changes and modifications may be made without departing from the spirit and scope of the invention as defined in the following claims.

What is claimed is:

1. An impedance matching circuit comprising:
    a code generating unit configured to generate a calibration code in response to a reference voltage and a voltage on a voltage node;
    a calibration resistance unit configured to supply a power supply voltage to the voltage node, and calibrated to an external resistor, wherein the calibration resistance unit includes a switching unit configured to turn on/off a plurality of resistors connected in parallel in response to the calibration code;
    a termination pull-up resistance unit provided at an output node configured to receive the calibration code, wherein the termination pull-up resistance unit has a switching unit identical to that of the calibration resistance unit; and a termination pull-down resistance unit at the output node, configured to receive the calibration code, wherein the termination pull-down resistance unit has a switching unit identical to that of the calibration resistance unit.

2. The impedance matching circuit of claim 1, wherein the external resistor is coupled between an external pad, which is coupled to the voltage node, and a ground voltage level.

3. The impedance matching circuit of claim 1, wherein the calibration resistance unit, the termination pull-up resistance unit and the termination pull-down resistance unit further include a plurality of resistors which are connected to each other in parallel, wherein the switching unit includes a plurality of switches connected to the plurality of resistors.

4. The impedance matching circuit of claim 3, wherein the switch includes:
an NMOS transistor having a gate configured to receive the calibration code; and
a PMOS transistor having a gate configured to receive an inverted code of the calibration code, wherein the NMOS transistors and the PMOS transistors are connected to each other in parallel.

5. The impedance matching circuit of claim 1, wherein the code generating unit includes:
a reference voltage generating unit configured to generate the reference voltage;
a comparator configured to compare the reference voltage to the node voltage; and
a counter configured to count the calibration code based on a comparison result of the comparator.

6. The impedance matching circuit of claim 1, wherein the code generating unit is configured to count the calibration code in a direction in which a resistance value becomes higher when the node voltage is higher than the reference voltage, and wherein the code generating unit counts the calibration code in a direction in which the resistance value becomes lower when the reference voltage is higher than the node voltage.

7. The impedance matching circuit of claim 1, wherein the output node is coupled to a data pad.

8. The impedance matching circuit of claim 1, wherein the voltage node is a ZQ node.

9. An impedance matching circuit comprising:
a code generating unit configured to generate a calibration code in response to a reference voltage and a voltage on a voltage node;
a calibration resistance unit configured to supply a ground voltage to the voltage node and calibrated to an external resistor, wherein the calibration resistance unit includes a switching unit configured to turning on/off a plurality of resistors connected in parallel in response to the calibration code;
a termination pull-up resistance unit provided at an output node configured to receive the calibration code, wherein the termination pull-up resistance unit has a switching unit identical to that of the calibration resistance unit; and
a termination pull-down resistance unit at the output node configured to receive the calibration code, wherein the termination pull-down resistance unit has a switching unit identical to that of the calibration resistance unit.

10. The impedance matching circuit of claim 9, wherein the external resistor is coupled between an external pad, which is coupled to the voltage node, and a power supply voltage level.

11. The impedance matching circuit of claim 9, wherein the calibration resistance unit, the termination pull-up resistance unit and the termination pull-down resistance unit further include a plurality of resistors which are connected to each other in parallel, wherein the switching unit includes the plurality of switches connected to the plurality of resistors, respectively.

12. The impedance matching circuit of claim 11, wherein the switch includes:
an NMOS transistor having a gate configured to receive the calibration code; and
a PMOS transistor having a gate configured to receive an inverted code of the calibration code, wherein the NMOS transistors and the PMOS transistors are connected to each other in parallel.

13. The impedance matching circuit of claim 9, wherein the code generating unit includes:
a reference voltage generating unit configured to generate a reference voltage;
a comparator configured to compare the reference voltage to the voltage on the node; and
a counter configured to count the calibration code based on a comparison result of the comparator.

14. The impedance matching circuit of claim 9, wherein the code generating unit is configured to count the calibration code in a direction in which a resistance value becomes lower when the node voltage is higher than the reference voltage, and wherein the code generating unit counts the calibration code in a direction in which the resistance value becomes higher when the reference voltage is higher than the node voltage.

15. The impedance matching circuit of claim 9, wherein the output node is coupled to a data pad.

16. The impedance matching circuit of claim 9, wherein the voltage node is a ZQ node.

* * * * *